(12) United States Patent
Eymery et al.

(10) Patent No.: US 8,461,031 B2
(45) Date of Patent: Jun. 11, 2013

(54) METHOD FOR MAKING A THIN-FILM STRUCTURE AND RESULTING THIN-FILM STRUCTURE

(75) Inventors: Joël Eymery, Sassenage (FR); Pascal Pochet, La Murette (FR)

(73) Assignee: Commissariat a l'Energie Atomique, Paris (FR)

( * ) Notice: Subject to any disclaimer, the term of this patent is extended or adjusted under 35 U.S.C. 154(b) by 476 days.

(21) Appl. No.: 12/091,857

(22) PCT Filed: Oct. 25, 2006

(86) PCT No.: PCT/FR2006/002400
§ 371 (c)(1),
(2), (4) Date: Apr. 28, 2008

(87) PCT Pub. No.: WO2007/048928
PCT Pub. Date: May 3, 2007

(65) Prior Publication Data
US 2008/0290471 A1    Nov. 27, 2008

(30) Foreign Application Priority Data

Oct. 28, 2005  (FR) .................................. 05 11079

(51) Int. Cl.
*H01L 21/265* (2006.01)
*H01L 21/02* (2006.01)
*H01L 29/02* (2006.01)

(52) U.S. Cl.
CPC .............................. *H01L 21/02694* (2013.01)
USPC ........... 438/530; 438/479; 438/492; 438/502; 438/509; 438/514; 438/788; 438/789

(58) Field of Classification Search
CPC ............ H01L 21/2007; H01L 21/26506; H01L 21/02694
USPC ................. 438/530, 788, 479, 492, 789, 502, 438/509, 514; 257/629, E21.46, E29.002, 257/E21.561
See application file for complete search history.

(56) References Cited

U.S. PATENT DOCUMENTS 4,617,066 A * 10/1986 Vasudev ......................... 438/515
5,495,824 A   3/1996 Yonehara et al.
(Continued)

FOREIGN PATENT DOCUMENTS

JP  56-045047 A  4/1981
JP  62-501320 A  5/1987
(Continued)

OTHER PUBLICATIONS

I. Golecki, H.L. Glass, G. Kinoshita; Reduction in crystallographic surface defects and strain in 0.2-um-thick silicon-on-sapphire films by repetitive implanation and solid-phase epitaxy; Appl. Phys. Lett 40(8); Apr. 15, 1982; p. 670-672.*
(Continued)

*Primary Examiner* — N Drew Richards
*Assistant Examiner* — John P Dulka
(74) *Attorney, Agent, or Firm* — Brinks Hofer Gilson & Lione

(57) ABSTRACT

A method for making a thin-film structure includes a thin film stabilized on a substrate. The structure of the thin film is defined by a material which includes at least one first chemical species. The method includes a step of inputting particles of the first chemical species into the thin film so as to compensate for the flow of vacancies from the surface of the film.

24 Claims, 5 Drawing Sheets

U.S. PATENT DOCUMENTS

| | | | |
|---|---|---|---|
| 5,602,045 A | | 2/1997 | Kimura |
| 5,661,044 A | * | 8/1997 | Holland et al. ............... 438/766 |
| 6,768,175 B1 | * | 7/2004 | Morishita et al. ............. 257/352 |
| 2004/0221792 A1 | * | 11/2004 | Forbes ............................... 117/4 |
| 2005/0217566 A1 | | 10/2005 | Mantl et al. |
| 2006/0211221 A1 | * | 9/2006 | Mantl et al. ................... 438/475 |
| 2007/0026650 A1 | * | 2/2007 | Hebras .......................... 438/514 |

FOREIGN PATENT DOCUMENTS

| | | |
|---|---|---|
| JP | 08-203842 A | 8/1996 |
| JP | 2006-524427 A | 10/2006 |
| WO | WO 00/19500 A1 | 4/2000 |
| WO | WO 2004/095553 A2 | 11/2004 |
| WO | WO 2004095553 A2 * | 11/2004 |

OTHER PUBLICATIONS

D. Skarlatos, D. Tsoukalas, L.F. Giles, A. Claverie; Point defect injection during nitrous oxidation of silicon at low temperatures; Journal of Applied Physics; vol. 87, No. 3; Feb. 1, 2000; p. 1103-1109.*

Golecki et al., Reduction in crystallographic surface defects and strain in 0.2-um-thick silicon-on-sapphire films by repetitive implantation and solid-phase epitaxy. Applied Physics Letters, AIP, American Institute of Physics, Melville, NY, U.S., vol. 40, No. 8, Apr. 1982 p. 670-672.*

Skarlatos et al., Estimation of the number of interstitial atoms injected in silicon during thin oxide formation; Journal of the Electrochemical Society, 1999, vol. 146. No. 6; p. 2276-2283.*

Tuppen, C. G. et al., Effects of implantation temperature on the properties of buried oxide layers in silicon formed by oxygen ion implantation; Applied Physics Letters, vol. 45 Issue 1; 1984; pp. 57-59.*

Wolf S. et al., Silicon Processing for the VLSI ERA vol. 1: Process Technology Second Edition; Lattice Press, 2000; pp. 326-327.*

Henri De Monestrol, et al., "Reactive Solid State Dewetting: Interfacial Cavitation in the System Ag-Ni-O" Interface Science, vol. 11, No. 4, Oct. 2003.

Zengfeng Di, et al., "Fabrication and mechanism of relaxed SiGe-on-insulator by modified Ge condensation", Journal of Vacuum Science & Technology B, vol. 23, No. 4, Jul./Aug. 2005.

Skarlatos et al., "Point defect injection during nitrous oxidation of silicon at low temperatures", Journal of Applied Physics, vol. 87, No. 3, pp. 1103-1109, Feb. 1, 2000.

International Search Report, May 3, 2007.

PCT Request in French.

PCT Written Opinion in French, May 3, 2007.

Golecki, et al., "Improvement of Crystalline Quality of Epitaxial Silicon-On-Sapphire by Ion Implantation and Furnace Regrowth", 205 Solid-State Electronics, vol. 23, 1980, July, XP-000819737.

Inoue, et al., "Crystalline Quality Improvement of SOS Films by SI Implantation and Subsequent Annealing", Nuclear Instruments and Methods 182/183 (1981), XP-000836643.

Schroer, et al., "Growth of Buried Oxide Layers of Silicon-on-Insulator Structures by Thermal Oxidation of the Top Silicon Layer", J. Electrochem, Soc., vol. 144, No. 6, Jun. 1997, XP-002392349.

Yamamoto, et al., "Electrical and Crystallographic Evaluation of SOS Implanted with Silicon and/or Oxygen", 2107B Nuclear Instruments & Methods in Physics Research, Section B B7/8 (1985) Mar., No. 1 Part I, XP 000037072.

Skarlatos, et al., "Estimation of the Number of Interstitial Atoms Injected in Silicon during Thin Oxide Formation", Journal of the Electrochemical Society, 146 (6) 2276-2283 (1999). XP-002392350.

Bracht, et al., "Properties of intrinsic point defects in silicon determined by zinc diffusion experiments under nonequilibrium conditions", Physical Review B, vol. 52, No. 23, Dec. 15, 1995. XP-002424752.

Golecki, et al., "Reduction in crystallographic surface defects and strain in 0.2-μm-thick siliconon-sapphire films by repetitive implantation and solid-phase epitaxy", vol. 40 (1982). XP-000816500.

Kirichenko et al.—"Interaction of Neutral Vacancies and Interstitials with the Si(001) Surface"—2004 The American Physical Society—pp. 70 045321-1 to 045321-7.

Holland et al., Technique to Suppress Dislocation Formation during High-Dose Oxygen Implantation of Si *Appl. Phys. Lett. 66*, Apr. 10, 1995, pp. 1892-1894.

Office Action from counterpart Japanese Application No. 2008-537140, dated Feb. 7, 2012, 7 pages (with translation).

* cited by examiner

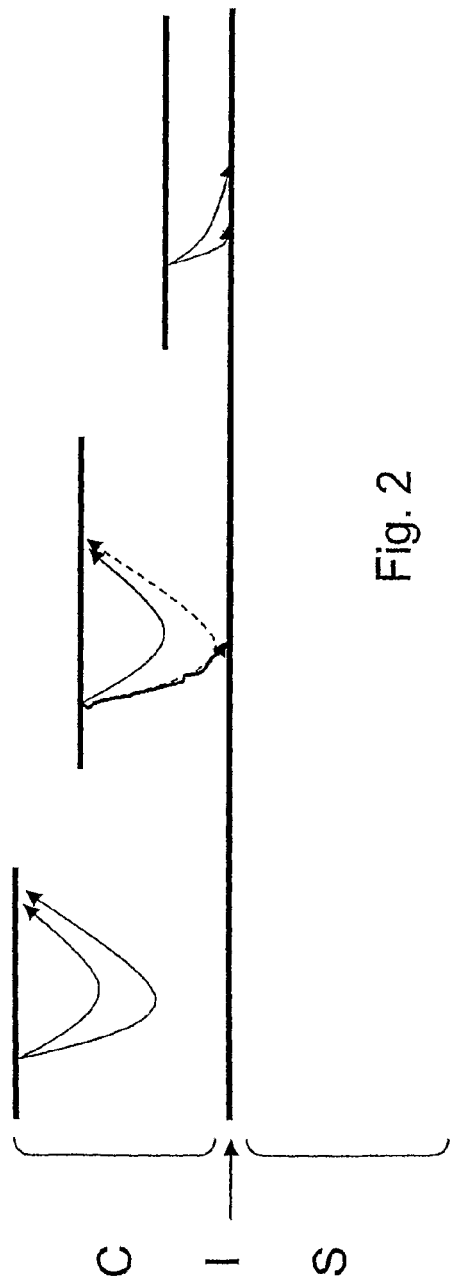

METHOD FOR MAKING A THIN-FILM STRUCTURE AND RESULTING THIN-FILM STRUCTURE

PRIORITY CLAIM

This application is a U.S. nationalization of PCT Application No. PCT/FR2006/002400, filed Oct. 25, 2006, and claims priority to French Patent Application No. 0511079, filed Oct. 28, 2005.

TECHNICAL FIELD

The present invention concerns a method of fabricating a thin-layer structure and the resulting thin-layer structure, and in particular, to the stabilization of morphological instabilities of thin films (typically less than 100 nm thick) on a substrate, in particular for the fabrication of semiconductor on insulator type devices, for example SOI (silicon on insulator) devices in the case of silicon.

BACKGROUND

Morphological instabilities, or structural instabilities, of thin films on a substrate block the production of numerous technology building bricks. This destabilization occurs during technology steps such as annealing, or if epitaxial stresses or mechanical stresses are present, such as those that result from temperature variations in the case of materials with different coefficients of expansion. The degree of destabilization is proportional to the difference between the surface energies of the film and the substrate. It can be amplified or accelerated by the existence of surface defects, defects at the interfaces or bulk defects, and is inversely proportional to the thickness of the film. In SOI devices, it is typical nowadays to seek to obtain films with a thickness of less than 10 nm, in which problems of the above type are liable to occur.

Dewetting and spreading are significant consequences of morphological instabilities. In the technical field to which the invention relates, solid phase dewetting is defined as a reduction in the area initially occupied by the layer on the substrate. In contrast, spreading is defined as an increase in the area. In certain particular cases, instability does not change the area between the layer and the substrate and modifies only the envelope of the layer, as represented in FIG. 1.

The hypotheses traditionally invoked to explain structural instabilities of monocrystalline thin layers are surface diffusion of material (H1), surface (and interface) energy, which depends on the crystal orientation concerned (H2), mechanical stress resulting from processes (whether suffered or applied intentionally) (H3), and chemical decomposition of the layer in the case of alloys (H4). In the case of polycrystalline thin layers, the influence of the grain boundaries is another destabilizing factor that has to be considered.

The routine solution to alleviate morphological instabilities is to encapsulate the thin layer in a material that controls the phenomena occurring in H1, H2 and H3. For example, if an SOI layer retains a thin surface layer of thermal or native Si oxide (of the order of 1.5 nm thick), the Si film becomes very stable even at high temperature (above 850° C.): surface diffusion of Si is blocked (H1), the surface energy of $SiO_2$ is lower than that of Si, and the elastic constraint remains low even for large variations in temperature. However, in several cases, such as epitaxial regrowth, the use of encapsulation is incompatible with the remainder of the process. Moreover, even if this layer is removed, it can then cause residual chemical contamination of the initial thin layer and modify the expected properties of the material or introduce other instabilities.

Using a low surface tension surfactant (for example antimony for a silicon film or gallium or bismuth for a gallium nitride film) can also be envisaged for alleviating dewetting linked to the surface energy difference (H2) and/or to modify surface diffusion (H1). However, this solution has the same drawbacks (cleaning difficulties).

The document "Reactive Solid State Dewetting: Interfacial Cavitation in the System Ag—Ni—O", H. de Monestrol, L. Schmirgeld-Mignot, S. Poissonnet, C. Lebourgeois, and G. Martin, Interface Science 11 (1003) 379-390 discloses that, the surface being an infinite source of vacancies, there exists between the surface and the volume a continuous stream of vacancies that can induce condensation of vacancies in the vicinity of the interface (I) of the layer (C) and the substrate (S), as shown in FIG. 2 for several layer thicknesses. Beyond a certain concentration, the vacancies join up to form cavities that become sources of instability that can lead to dewetting of the layer; moreover, this effect becomes stronger as the thickness of the layer is reduced, as can be seen clearly in FIG. 2.

Moreover, it is known that these mechanisms are exacerbated in particular by the presence of surface structural defects (for example, pinholes, emergent dislocations, roughness, and the like) or bulk structural defects (grain boundaries), and by the presence of defects of a chemical nature (departure from stoichiometric conditions, presence of foreign bodies and segregation, and the like) or by the conditions at the boundaries of the thin layers (edge effect, geometry effect, size and orientation).

A method of reducing certain defects in crystals of silicon on sapphire (SOS) by amorphization by implantation of silicon ions followed by annealing is disclosed, for example, in the papers "Reduction in crystallographic surface defects and strain in 0.2-μm-thick silicon-on-sapphire films by repetitive implantation and solid-phase epitaxy", Golecki I. et al., in Applied Physics Letters, AIP, American Institute of Physics, Melville, N.Y., US, Vol. 40, N° 8, April 1982 (1982-04) and "Improvement of crystalline quality of epitaxial silicon-on-sapphire by ion implantation and furnace regrowth", Golecki I. et al., Solid State Electronics, Elsevier Science Publishers, Barking, GB, Vol. 23, NO 7, July 1980.

PCT patent application no. WO 2004/095 553 describes the preparation of structures including strained films on a substrate. The basic principle relies on the use of ion implantation to produce a defect area within a stack of layers (in/under certain of them) and thus enable relaxation of certain of them prior to heat treatment.

The paper "Crystalline quality improvement of SOS films by SI implantation and subsequent annealing", Inoue T. et al., in Nuclear Instruments & Methods in Physics Research, North-Holland Publishing Company. Amsterdam, NL, Vol. 182/183, no. Part 2, April 1981, describes a method of improving the quality of SOS films by Si ion implantation and amorphization.

The paper "Electrical and crystallographic evaluation of SOS implanted with silicon and/or oxygen", Yamamoto Y. et al., in Nuclear Instruments & Methods in Physics Research, section-B: Beam interactions with materials and atoms, Elsevier, Amsterdam, NL, Vol. B7/8, n. 1, Part 1, A March 1985, concerns a process that relates in particular to SOS type devices. The objective of the process is to improve the quality of the crystals by inhibiting diffusion of aluminum atoms from the substrate to the silicon layer. For this the authors recommend oxygen ion implantation or co-implantation of ions of oxygen and ions of silicon so that the silicon is amorphized.

Finally, U.S. Pat. No. 4,617,066 proposes a method of preparing crystals having abrupt P and N regions. The method necessitates an amorphization step after which ions are implanted in the structure.

However, no solution to the problem of morphological instabilities envisages the influence of volume diffusion, in particular the role of vacancy diffusion, and current techniques remain somewhat unsatisfactory as to their response to the drawbacks of one of the more serious phenomena in this field.

SUMMARY

In order to solve these various problems, and therefore in particular to stabilize the thin film to delay (or even prevent) the occurrence of morphological instabilities, and especially dewetting, the invention proposes a method for fabricating a thin-layer structure comprising a thin film on a substrate, the structure of the thin film being defined by a material comprising at least one first chemical species, characterized by a step of introducing particles of said first chemical species into said thin film in such a manner as to compensate the stream of vacancies coming from the surface of said film.

Thus the stream of vacancies at the surface of the thin film can be at least partially compensated by the introduction of the particles mentioned above. This stabilizes the thin film. In this sense, these particles could be referred to as "supernumerary particles" or preferably as "supernumerary atoms".

Thus the aim is further introduction of chemical elements already present in a material constituting the film.

The method is usable in particular for thin semiconductor films. The method applies in particular to thin films consisting of a single material (doped or undoped, constrained or unconstrained), especially those employed in the semiconductor on insulator industry, and in particular silicon and germanium.

The method also applies to thin films consisting of a plurality of elements or a plurality of materials and especially films consisting of defined alloys or compounds (doped or undoped, strained or unstrained), such as SiGe and SiGeC alloys, defined compounds such as silicon carbide (SiC) or gallium nitride (GaN), and alloys of defined compounds, for example (GaAl)N or (GaIn)N.

In this case, the average composition must be chosen to preserve the intrinsic physical properties of the layer. To this end, the introduction of supernumerary particles advantageously corresponds to the average composition of the defined alloy or compound. Thus the thin film advantageously consists of a defined alloy or compound selected from SiGe, SiGeC, SiC, GaN, (GaInAl)N.

The thin film in the sense of the present invention is either monocrystalline or polycrystalline, but preferably has a grain size $d_g$ sufficiently large for there to be no destabilization, encouraged for the most part by the grain boundaries. An order of magnitude of this grain size $d_g$ to satisfy this condition is $d_g$ is greater than $10*e$, where e is the thickness of the thin film.

The substrate is preferably a material usually employed as a substrate in the semiconductor on insulator industry, for example uncrystallized solids such as amorphous materials consisting for example of $SiO_2$ or $HfO_2$, or crystalline compounds, for example those consisting of $SiO_2$, such as quartz or cristobalite, or those consisting of other chemical elements, for example sapphire $Al_2O_3$.

The introduction of particles of said first chemical species (supernumerary particles) is advantageously effected in such a manner as to compensate the total stream of vacancies created during the step tending to destabilize the structure and coming into the film from the surface. The introduction can be such that the number of vacancies is significantly less than the number of particles introduced. Such introduction can be effected by physical implantation with a source of ions accelerated by an electric or magnetic field, for example.

To optimize the experimental operating point, it is possible to carry out beforehand a step of measuring or evaluating the stream of vacancies as a function of the thickness of the film (or depth from the surface). The evaluation can use the Fick diffusion equations and the known formation and migration energy of a surface and volume vacancy:

$$(C_{surface}-C_z)/(C_{surface}-C_{volume})=\mathrm{erf}[0.5*z/(D_{volume}*t)^{0.5}],$$

where $C_z$ is the concentration of vacancies at a distance z from the surface at time t, $C_{surface}$ ($C_{volume}$) is the concentration of surface (volume) vacancies, $D_{volume}$ is the diffusion coefficient of the vacancies by volume and erf is the error function.

Surface vacancy formation energies are generally lower than volume vacancy formation energies. In the case of silicon, values can be found in the papers "Properties of intrinsic point defects in silicon determined by zinc diffusion experiments under nonequilibrium conditions", H. Bracht, N. A. Stolwijk, and H. Mehrer, Physical Review B 52 (1995) 16542-16560, for the volume energies, and "Interaction of neutral vacancies and interstitials with the Si(001) surface", T. A. Kirichenko et al., Physical Review B 70 (2004) 045321, for the formation of surface vacancies.

From this equation, it is possible to establish a representation of the vacancy concentration as a function of depth at various temperatures. However, this representation does not take account of "well" forces linked to interactions between the substrate and the film. In relation to this simplified case, the area of the film and the interface between the film and the substrate serve as vacancy elimination wells, as can be seen in FIG. 2. These forces are linked to the structural and chemical quality of the interface. This effect can be very serious, depending on the structural quality of the interface between the thin film and the substrate. For example, in the case of a silicon film attached to an $SiO_2$ substrate, the well force is higher than that of an interface obtained by thermal growth or by controlled deposition (for example, molecular beam epitaxy). It is then necessary, by empirical determination or evaluation, to adapt the quantity of supernumerary particles to be introduced in such a manner as to compensate the stream of vacancies between the surface of the film and the film-substrate interface.

The implantation parameters, and in particular the dose and the energy, can be adapted according to the requirements of the user and more particularly according to the stream of vacancies to be compensated in the film of interest. The choice of the energy is guided to a first approximation by the thickness of the film to be processed, the dose then adjusting the final concentration of the supernumerary particles. Optimization of the experimental operating point can furthermore be improved by using an implantation mask (deposited on the thin film) the thickness and the nature of which constitute two additional adjustment parameters.

In the sense of the invention, the experimental operating point at implantation time is the optimum adjustment for incorporating sufficient supernumerary particles to prevent dewetting, allowing for the imposed technology steps (annealing, special atmosphere, epitaxial regrowth, and the like) that give rise to risks of destabilization of the structure.

An alternative method to implantation consists in using a process that generates particles of the first chemical species (in particular, the supernumerary particles) in the layer such as a surface chemical reaction that releases these particles thanks to its reaction diagram. For example, in the case of silicon, oxidation introduces interstitial vacancies under the $SiO_2/Si$ interface that serve as supernumerary particles. The quantity introduced can be controlled as a function of the annealing time or the nature of the oxidizing gas or fluid. Determining the operating point for SOI by this method can be carried out, for example, as described in the documents "Estimation of the number of interstitial atoms injected in silicon during thin oxide formation", D. Skarlatos, M. Omri, A. Clayerie, and D. Tsoukalas, J. Electrochem. Soc. 146 (6) (1999) 2276-2283 and "Growth of buried oxide layers of silicon on insulator structures by thermal oxidation of the top silicon layer", E. Schroer, S. Hopfe, Q. Y. Tong, U. Gösele, and W. Skorupa, J. Electrochem. Soc, 144 (6) (1997) 2205-2210), which describe in detail the quantity of interstitials introduced as a function of oxidation time, oxidation temperature, and oxidation atmosphere.

The supernumerary particles can be introduced by implantation in the film alone or in the film and the substrate. To define the implantation area precisely, it is possible to use masks to protect the areas in which implantation is not required (see FIG. 4 for example). The process can therefore include a step of masking the substrate using a mask 3' prior to the implantation step. The mask used can be selectively removed at a later stage.

In the case of implantation, as already mentioned, it is possible to employ a mask deposited 3 on the film by modulating the thickness of the mask it is possible to vary the depth to which the supernumerary particles are implanted. (see FIG. 5 for example). Possible options are shown in the case of a silicon film:

1) a pointed profile in the thickness of the layer (in particular, with a low energy in the absence of any mask or with a thin mask), and 2) a profile tail in the thickness of the layer (such as with a high energy and a thick mask), having the advantage of spatially decorrelating the supernumerary particles and the implantation defect.

According to one embodiment, it is possible for the substrate and the film to be covered with respective masks 3 and 3', preferably of different kinds (see FIG. 9 for example).

Moreover, the method according to the invention can include a step of determining the quantity of vacancies to be filled to optimize the effect of the particle introduction step.

The method can further include a supplementary doping step; it is then particularly advantageous for the doping and the implantation of supernumerary particles to be effected on the same implanter to minimize handling.

Doping will consist in implanting at least one chemical species different from that of the supernumerary particles (in particular, that does not form part of the structural composition of the thin film), like those usually employed to modify electrical properties, such as boron, arsenic, antimony or phosphorus in the case of semiconductors from column IV of the periodic table. The presence of these dopants could advantageously modify the properties of the surface (H2). Known techniques can be used to implant dopants, in particular those also employed here to implant supernumerary particles.

There can also be provision for the method to comprise a supplementary heat treatment step. Annealing will preferably be effected after implanting particles of the first chemical species (supernumerary particles) and will eliminate defects that could be introduced during implantation. This treatment is particularly useful if the stream of vacancies is not precisely determined. The heat treatment can be applied with or without masking; according to one practical embodiment, this heat treatment could also remove any mask deposited on the substrate.

Such a method can therefore include, after the step of stabilization by means of introduction of particles, a step tending to destabilize the structure such as a step of epitaxial regrowth directly on the film, without consequences for the structure thanks to the stabilization step.

The invention also concerns a method of determining the number of vacancies to be filled in a film deposited on a substrate characterized in that supernumerary particles are incorporated in said film. For given implantation conditions (energy, thickness of the mask), determining the minimum dose to ensure stability of the film provides an indirect route to determining the concentration of vacancies emitted by the surface during destabilization annealing. Determining this minimum dose therefore yields a good estimate of the number of vacancies.

The invention also concerns thin-layer structures comprising a thin film on a substrate that can be obtained by any of the methods described hereinabove.

Unlike the prior art, methods according to the invention preserve the intrinsic properties of the material that is treated. What is more, the invention is generic in relation to the materials of the thin layer and their geometrical characteristics. Moreover, there are few technology process steps and they are compatible with semiconductor technologies, including epitaxial regrowth on the thin layer.

Further, the invention prevents solid phase dewetting in the semiconductor on insulator stacks, hereinafter denoted XOI (X on insulator, where X represents the chemical formula of the semiconductor concerned). In practice, it delays this phenomenon sufficiently for it not to be observed, for example during annealing.

BRIEF DESCRIPTION OF THE DRAWING

The technical advantages of the present invention will emerge more clearly from a reading of the following examples and from the Figures, which provide a non-exhaustive illustration of the invention. In the drawings:

FIG. 1 represents surface instabilities;

FIG. 2 represents the stream of vacancies between a layer and a substrate for different thicknesses of the layer;

DETAILED DESCRIPTION

Figure 3:
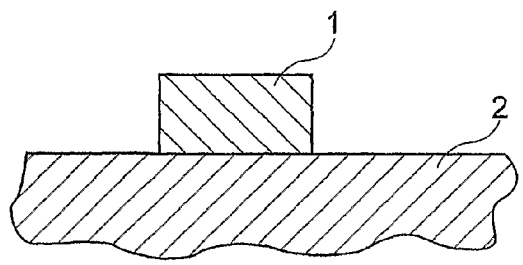
FIG. 3 represents a thin film on a substrate.

There is described next an embodiment of a method of the invention in the case of a thin film 1 of silicon (Si) on a substrate 2 of silicon dioxide ($SiO_2$) typical of an SOI structure, as represented in FIG. 3.

The first step is to determine the stream of vacancies in the $Si/SiO_2$ thin layer structure during the step tending to destabilize the structure.

In this example, the destabilizing step is an epitaxial regrowth annealing step carried out in an ultra-vacuum or a controlled atmosphere, the objective whereof is to improve the structural and chemical quality of the surface. As a function of the annealing time and temperature (generally between 650 and 900° C.), the concentration of vacancies introduced can be estimated from the Fick diffusion equations already referred to and the surface and volume vacancy formation and migration energy.

Referring to the papers already mentioned by Bracht et al. in respect of the measured volume vacancy formation and migration energies and Kirichenko et al. in respect of the volume and surface vacancy formation energies computed (by ab initio methods), the values of the various parameters are as follows:

$$C_{volume}=1.4*10^{23}\exp(-2.0/kT)cm^{-3}$$

$$D_{volume}=3*10^{-2}\exp(-1.8/kT)cm^2/s$$

$$E_{f(volume\ ab\ initio)}=3.6\ eV$$

$$E_{f(surface\ ab\ initio)}=1.2\ eV\ (i.e.\ \sim 60\%\ of\ the\ volume\ value)$$

For the subsequent estimation of the vacancy concentration, the surface vacancy formation energy $E_{surf}$ (which is used to compute $C_{surf}$ from the Fick equation mentioned above) can be considered a parameter that is not accurately known. Its effect can therefore be estimated using the experimental values of Bracht et al. with a weighting of the volume vacancy formation energy of the same order as that encountered in the ab initio computation, everything else being unchanged.

The cleaning heat treatment before epitaxial regrowth takes a few minutes in a hydrogen $H_2$ atmosphere at a temperature between 650° C. and 900° C. (typically 0 to 30 minutes, the duration decreasing as a function of temperature).

Figure 8:
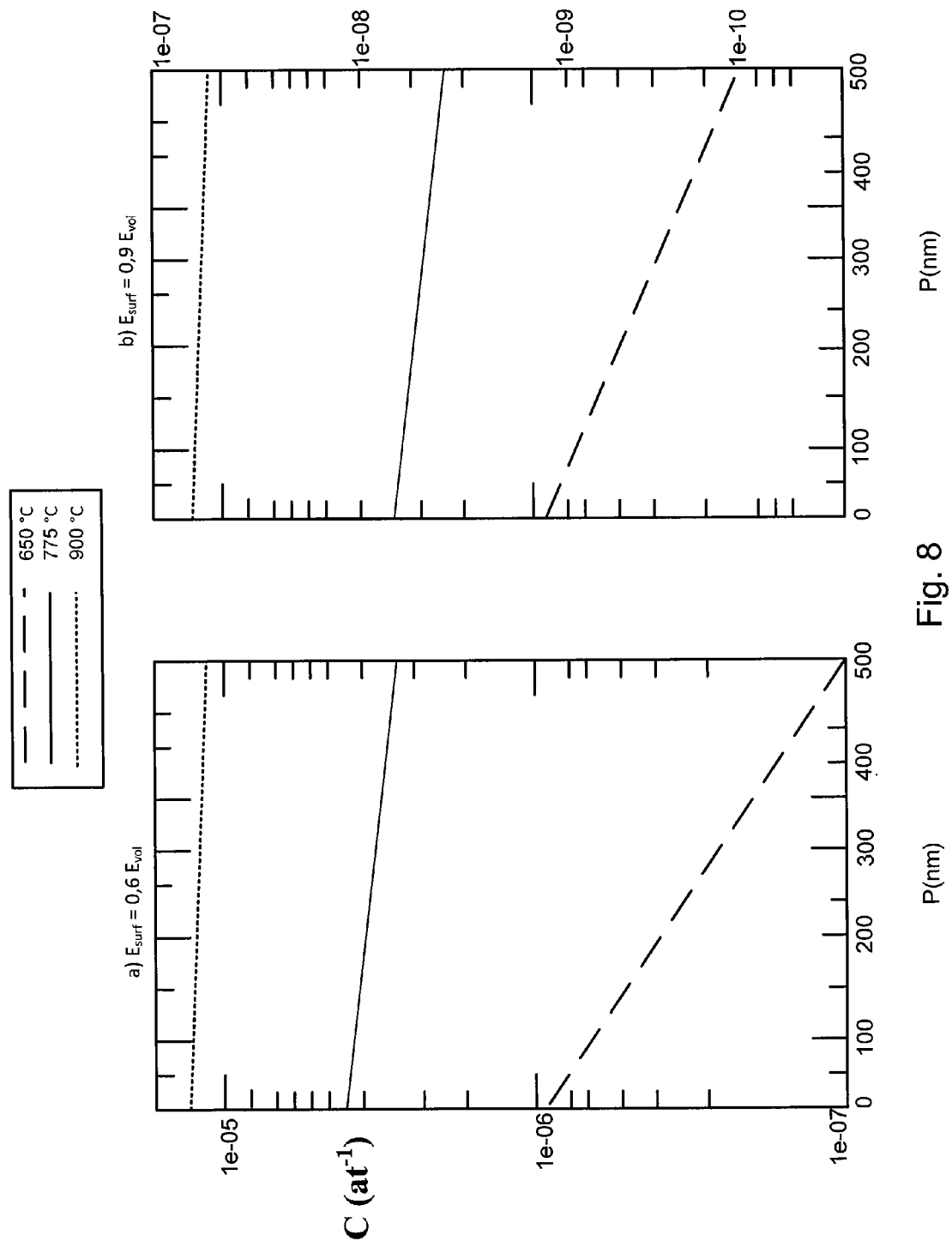
FIG. 8 represents the concentration of vacancies C ($at^{-1}$) after 2 minutes of annealing at 650, 775 and 900° C., respectively, as a function of the thickness of the layer P (nm) for two weightings of the surface vacancy formation energy $E_{surf}$ relative to the volume energy $E_{vol}$.

FIG. 8 shows the vacancy concentration after 2 minutes of annealing (tending to destabilize the structure) as a function of the thickness of the layer for three characteristic temperatures. Note that for thin layers less than 100 nm thick the volume equilibrium concentration is never reached. Virtually all of the layer is supersaturated by the stream of vacancies coming from the surface. This is the stream to be compensated by introducing supernumerary particles.

Figure 4:
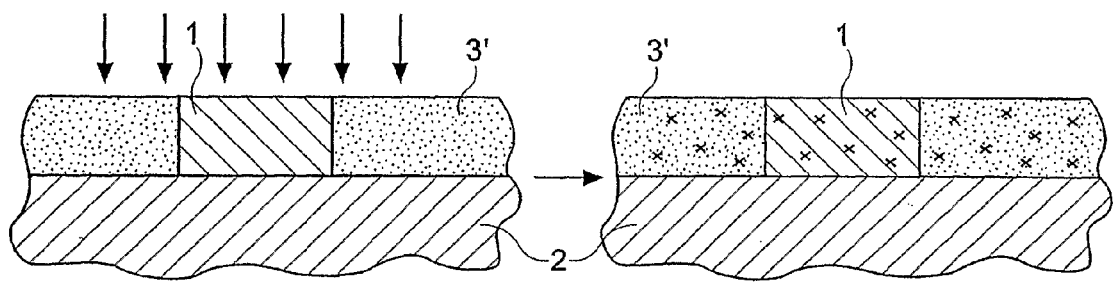
FIG. 4 represents an implantation step using a masked substrate.
Figure 5:
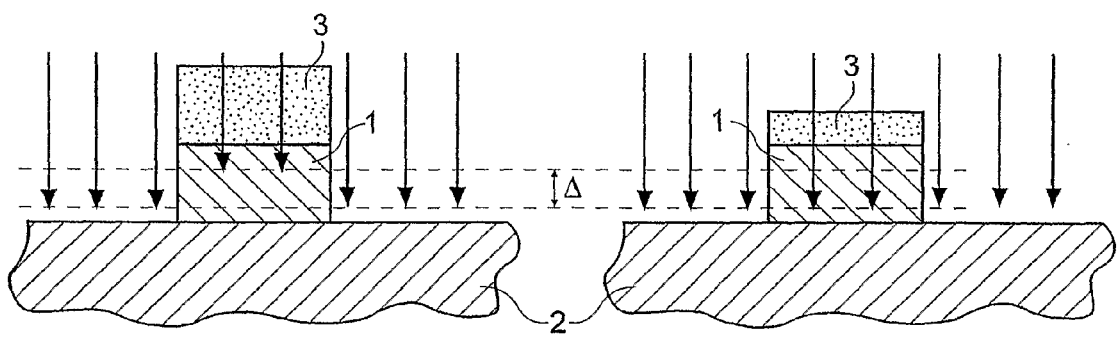
FIG. 5 is a diagram of the modulation of the implantation depth as a function of the thickness of the mask on the thin film.
Figure 9:
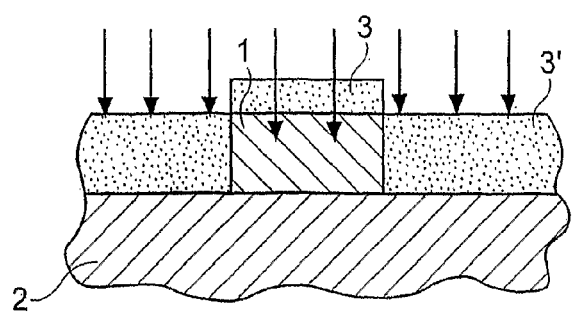
FIG. 9 represents an example in which the use of a mask for protecting the substrate (as in FIG. 4) is combined with the use of a mask for modulating the depth of implantation in the film (as in FIG. 5).

To this end silicon (Si) is implanted in the $Si/SiO_2$ thin layer structure, as illustrated in FIGS. 4 and 5, to introduce the necessary quantity of supernumerary particles, including the quantity intended to compensate any thinning steps that may be used (HF-based thermal oxidation and selective deoxidation).

Figure 6:
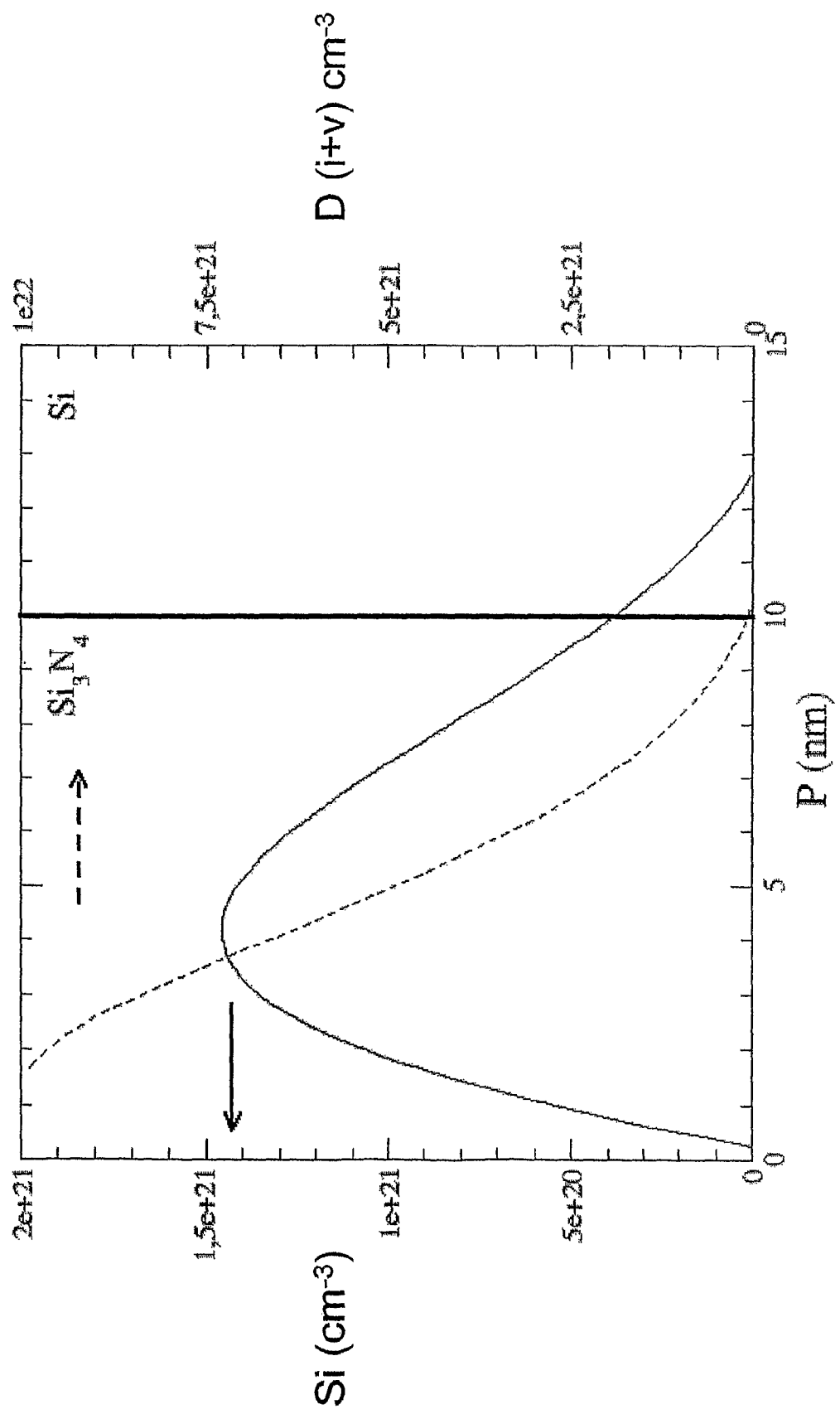
FIG. 6 represents profiles of silicon containing supernumerary particles (on the left) and irradiation (interstitial+vacancy) defects D (on the right) following implantation of $10^{15}$ ions of silicon per $cm^2$ at 3 keV in a layer of silicon covered with 10 nm of silicon nitride as a function of the depth P (nm)
Figure 7:
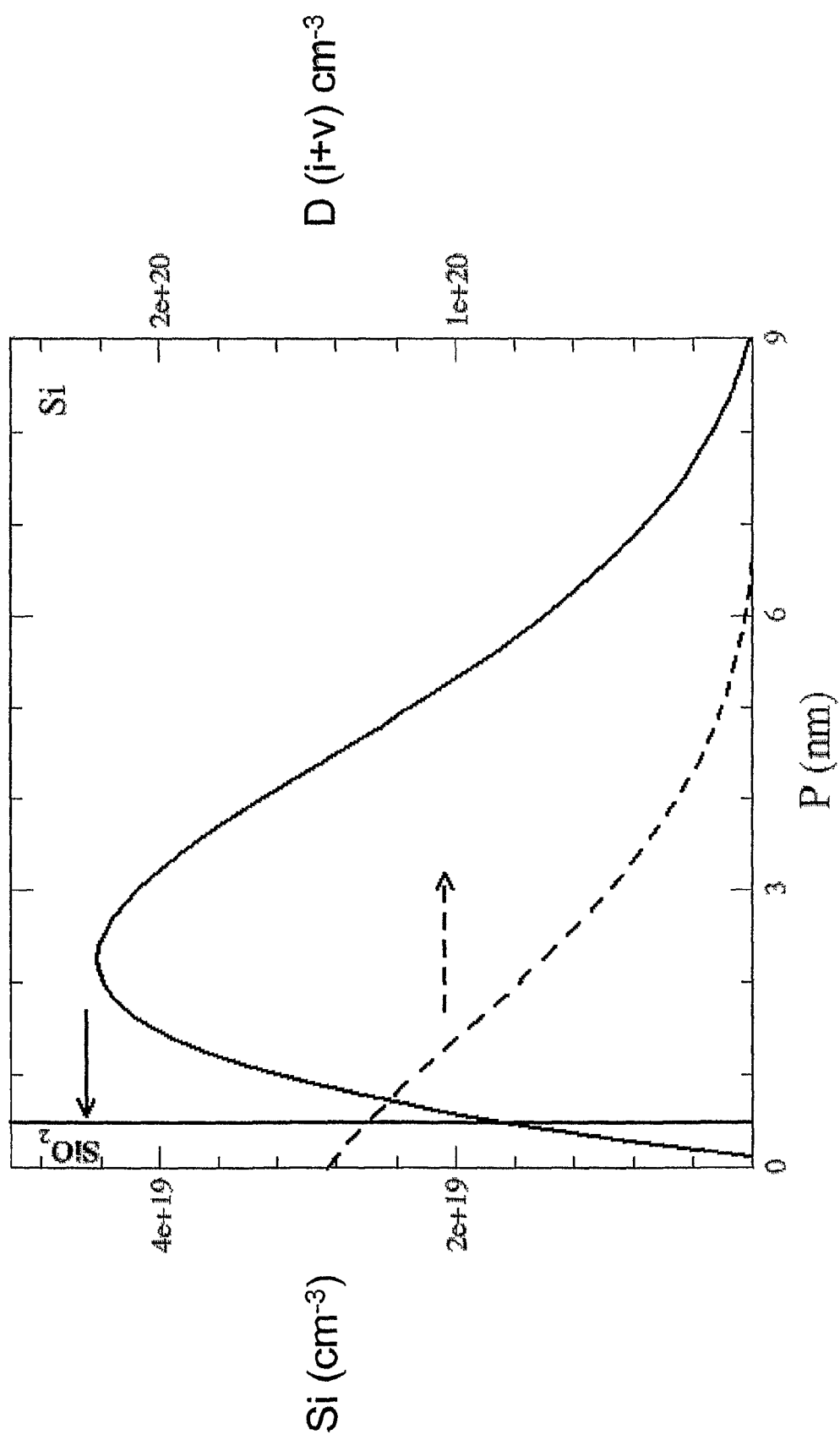
FIG. 7 represents profiles of silicon containing supernumerary particles (on the left) and irradiation (interstitial+vacancy) defects D (on the right) following implantation of $2*10^{13}$ ions of silicon per $cm^2$ at 1 keV in a 0.5 nm layer of oxidized silicon as a function of the depth P (nm)

As a general rule, this type of implantation can be used in a thin layer in two ways by adjusting the thickness of the oxide layer that serves as a mask 3':

1) either using the supernumerary particles of the implantation "tail", which limits the presence of defects just after implantation, so that the number of vacancies is then significantly less than the number of particles introduced (see FIG. 6); or 2) using the supernumerary particles of the implantation maximum, in which case a large number of defects results (no doubt with the formation of interstitial loops during annealing) that can nevertheless be limited by operating at low energies (FIG. 7).

The benefit of the first solution can be obtained by population decoupling between implantation defects (vacancies, interstitials) and the incorporated supernumerary particles (in particular, the implanted ions in this case). In addition to the thickness and the nature of the encapsulation layer, the following can be adjusted:

1) the implantation energy, which adjusts the depth of the profile as a function of the initial thickness;

2) the dose, which adjusts the concentration of supernumerary particles.

These two parameters are not linked; the first is used to choose the general shape of the profile (for example a peaked or unpeaked distribution in the layer); the second is used to adjust the quantity without modifying the profile.

The above two examples of implantation profiles for Si in silicon (100) use the following numerical values:

FIG. 6: $1*10^{15}$ ions/$cm^2$ of Si at 3 keV in a silicon substrate covered with 10 nm of silicon nitride;

FIG. 7: $2*10^{13}$ ions/$cm^2$ of Si at 1 keV in an oxidized silicon substrate (0.5 nm of $SiO_2$).

To find the optimum operating point experimentally when the aim is to stabilize a 7 nm SOI during epitaxial regrowth annealing of 2 minutes at 900° C., for example, the protocol to use is as shown hereinafter:

1) 7 nm samples of SOI are covered with a 17 nm thick $SiO_2$ mask;

2) silicon ions are implanted at 3 keV in several of these samples with doses varying from $1*10^{12}$ to $5*10^{14}$ ions/$cm^2$, one sample being retained as a reference;

3) the rate of dewetting at 900° C. is measured for all samples;

4) the optimum dose for preserving the SOI unwetted for 2 minutes defines the experimental operating point (with this energy, this thickness and this kind of mask) corresponding to this material and this destabilizing treatment.

The same type of protocol can be applied directly to a layer of germanium or of SiGe on $SiO_2$ and to strained thin layers of silicon, germanium or their alloys, obtained by molecular bonding, for example.

Optimizing the operating point should also take account of any step leading to the incorporation of supernumerary particles during the production of the layer. This is the case for SiGeOI (SiGe on insulator), for example, if the oxidation localization technique described in the paper "Fabrication and mechanism of relaxed SiGe-on-insulator by modified Ge condensation", Zengfeng Di, Miao Zhang, Weili Liu, Suhua Luo, Zhitang Song, Chenglu Lin, Anping Huang, and Paul K. Chu, J. Vac. Sci. Technol. B 23, 1637 (2005) is used.

Alternatively, the particles of the structural chemical species (supernumerary particles) can be introduced by means of a chemical reaction, such as oxidation, possibly including consumption of a sacrificial layer. This effect can be superimposed on (and in particular be complementary to) implantation. It will then be necessary to optimize the operating time and conditions (especially the temperature) to obtain a layer of required thickness with an appropriate concentration of supernumerary particles.

The invention claimed is:

1. A method for fabricating a thin-layer structure comprising a thin film on a substrate, the structure of the thin film defined by a material comprising at least one first chemical species, the method comprising:
   performing a process that tends to destabilize the thin film and form a stream of vacancies; and
   introducing particles of the at least one first chemical species into the thin film before destabilizing the thin film in such manner as to compensate the stream of vacancies coming from a surface of the thin film, so as to stabilize the thin film on the substrate and minimize dewetting of the thin film from the substrate,
   wherein
   the number of vacancies is substantially less than the number of particles introduced.

2. The method according to claim 1, wherein the thin film comprises a semiconductor material.

3. The method according to claim 1, wherein the thin film comprises silicon or germanium.

4. The method according to claim 1, wherein the thin film comprises a defined compound or an alloy chosen from SiGe, SiGeC, SiC, GaN, or (GaInAl)N.

5. The method according to claim 1, wherein the thin film comprises a single material.

6. The method according to claim 1, wherein the thin film comprises a plurality of chemical elements.

7. The method according to claim 1, wherein the thin film further comprises a dopant of a second chemical species different from the at least one first chemical species.

8. The method according to claim 1, wherein the thin film comprises a strained material.

9. The method according to claim 1, wherein the substrate comprises uncrystallized materials or crystalline compounds.

10. The method according to claim 1, wherein the substrate comprises amorphous materials including $SiO_2$ or $HfO_2$ or crystalline compounds including $SiO_2$ or sapphire $Al_2O_3$.

11. The method according to claim 1, wherein performing a process that tends to destabilize the thin film comprises creating morphological instability in the thin film.

12. The method according to claim 11, wherein introducing particles comprises generating the particles by means of a chemical reaction that releases the particles.

13. The method according to claim 12, wherein the chemical reaction comprises oxidation.

14. The method according to claim 1, wherein introducing particles comprises implantation.

15. The method according to claim 14 further comprising covering the substrate with a mask during the step of introducing particles.

16. The method according to claim 14 further comprising covering the thin film with a mask during the step of introducing particles.

17. The method according to claim 1, further comprising a heat treatment step carried out after introducing particles and before destabilizing the thin film.

18. The method according to claim 1, further comprising a step of determining a quantity of vacancies to be filled.

19. The method according to claim 1, further comprising a preliminary step of evaluating or determining empirically the quantity of particles to be introduced.

20. The method according to claim 19, wherein the evaluation is effected using Fick diffusion equations and a known surface and volume vacancy formation and migration energy:

$$(C_{surface}-C_z)/(C_{surface}-C_{volume})=\mathrm{erf}[(0.5*z)/((D_{volume}*t))\exp 0.5)],$$

where $C_z$ is the concentration of vacancies at a distance z from the surface at time t, $C_{surface}$ ($C_{volume}$) is the surface (volume) vacancy concentration, $D_{volume}$ is the volume diffusion coefficient of the vacancies, and erf is the error function.

21. The method according to claim 19, further comprising determining an optimum operating point that corresponds to optimum adjustments for incorporating sufficient particles to prevent dewetting.

22. The method according to claim 1, further comprising a doping step.

23. A thin layer structure obtained by the method according to claim 1.

24. The method according to claim 1, wherein destabilizing the thin film comprises epitaxial regrowth annealing of the thin film.

* * * * *